United States Patent
Park et al.

(10) Patent No.: US 12,550,569 B2
(45) Date of Patent: Feb. 10, 2026

(54) DISPLAY DEVICE AND MANUFACTURING METHOD THEREOF

(71) Applicant: Samsung Display Co., LTD., Yongin-si (KR)

(72) Inventors: Joon Seok Park, Yongin-si (KR); Jongdo Keum, Yongin-si (KR); Hyoung Do Kim, Yongin-si (KR); Yun Yong Nam, Yongin-si (KR); Chul Won Park, Yongin-si (KR); Kilim Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 429 days.

(21) Appl. No.: 18/297,052

(22) Filed: Apr. 7, 2023

(65) Prior Publication Data
US 2024/0049544 A1    Feb. 8, 2024

(30) Foreign Application Priority Data
Aug. 3, 2022   (KR) .................. 10-2022-0096804

(51) Int. Cl.
*H10K 59/131*    (2023.01)
*H10K 59/12*    (2023.01)
*H10K 59/124*    (2023.01)

(52) U.S. Cl.
CPC ..... *H10K 59/1315* (2023.02); *H10K 59/1201* (2023.02); *H10K 59/124* (2023.02)

(58) Field of Classification Search
CPC ........... H10K 59/1315; H10K 59/1201; H10K 59/124

USPC .......................................................... 257/72
See application file for complete search history.

(56) References Cited

U.S. PATENT DOCUMENTS

| 10,811,438 | B2 | 10/2020 | Choi |
| 2017/0338353 | A1 | 11/2017 | Koezuka et al. |
| 2020/0105789 | A1* | 4/2020 | Fang ..................... G03F 7/2024 |
| 2021/0265439 | A1* | 8/2021 | Peng .................. H10D 30/6757 |
| 2023/0253410 | A1* | 8/2023 | Zhang .................... H10D 86/00 |
| | | | 257/204 |

FOREIGN PATENT DOCUMENTS

| KR | 10-2016-0017867 | 2/2016 |
| KR | 10-2018-0071451 | 6/2018 |
| KR | 10-2019-0014765 | 2/2019 |
| KR | 10-2021-0129294 | 10/2021 |

OTHER PUBLICATIONS

Rongsheng Chen et al., "Self-aligned top-gate InGaZnO thin film transistors using SiO2/Al2O3 stack gate dielectric", Thin Solid Films, Sep. 17, 2013, pp. 572-575, vol. 548.

* cited by examiner

*Primary Examiner* — Xia L Cross

(57) ABSTRACT

A display device includes: a substrate; a conductive pattern layer disposed on the substrate; a buffer layer disposed on the conductive pattern layer; an active pattern layer disposed on the buffer layer and including a channel region and a conductive region adjacent to the channel region; an insulating pattern layer disposed on the channel region; an oxide pattern layer disposed on the insulating pattern layer; a gate electrode disposed on the oxide pattern layer; and a connecting member electrically connected to the conductive pattern layer and the conductive region. The connecting member and the oxide pattern layer include a same material.

20 Claims, 15 Drawing Sheets

DISPLAY DEVICE AND MANUFACTURING METHOD THEREOF

CROSS-REFERENCE TO RELATED APPLICATION(S)

This application claims priority to and benefits of Korean Patent Application No. 10-2022-0096804 under 35 U.S.C. § 119, filed on Aug. 3, 2022, in the Korean Intellectual Property Office, the entire contents of which are incorporated herein by reference.

BACKGROUND

1. Technical Field

Embodiments relate to a display device and a manufacturing method of the display device.

2. Description of the Related Art

Display devices such as a liquid crystal display (LCD) and an organic light diode (OLED) display include a display panel including a plurality of pixels for displaying images. Each pixel includes a pixel electrode for receiving a data signal, and the pixel electrode is connected to at least one transistor to receive a data signal.

To manufacture the display device, layers of various types of materials are stacked on a substrate, and the layers are patterned according to a method such as a photolithography process including an exposure method by using optical masks so various electrical devices such as transistors and conductors may be formed.

The above information disclosed in this Background section is only for enhancement of understanding of the background of the invention, and therefore it may contain information that does not form the prior art that is already known in this country to a person of ordinary skill in the art.

SUMMARY

Embodiments provide a display device and a manufacturing method of the display device capable of reducing a manufacturing cost and time by reducing the number of masks used for a manufacturing process and by controlling a carrier concentration of a channel region of a transistor of the display device, and capable of reducing deterioration of characteristics of a light-emitting device by reducing contact resistance between conductive layers.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device may include: a substrate; a conductive pattern layer disposed on the substrate; a buffer layer disposed on the conductive pattern layer; an active pattern layer disposed on the buffer layer and including a channel region and a conductive region adjacent to the channel region; an insulating pattern layer disposed on the channel region; an oxide pattern layer disposed on the insulating pattern layer; a gate electrode disposed on the oxide pattern layer; and a connecting member electrically connected to the conductive pattern layer and the conductive region, wherein the connecting member and the oxide pattern layer may include a same material.

The oxide pattern layer and the connecting member may include an oxide semiconductor.

A carrier concentration of the connecting member may be higher than a carrier concentration of the oxide pattern layer.

The display device may further include a first insulating layer disposed between the connecting member and the buffer layer, wherein the first insulating layer and the insulating pattern layer may include a same insulating material.

The first insulating layer and the buffer layer may have a first opening exposing the conductive pattern layer, the conductive region may include a first conductive region adjacent to a first side of the channel region, and the connecting member may include a first connecting member electrically connected to the conductive pattern layer and the first conductive region through the first opening.

The display device may further include a second insulating layer disposed on the gate electrode and the connecting member, wherein the second insulating layer may contact an upper surface of the gate electrode and an upper surface of the connecting member.

The display device may further include a third insulating layer disposed on the second insulating layer; and a pixel electrode disposed on the third insulating layer, wherein the second insulating layer and the third insulating layer may have a second opening exposing the first connecting member, and the pixel electrode may be electrically connected to the first connecting member through the second opening.

The display device may further include a driving voltage line. The driving voltage line and the conductive pattern layer may include a same conductive material. The first insulating layer and the buffer layer may have a third opening exposing the driving voltage line, the conductive region may include a second conductive region adjacent to a second side of the channel region, and the connecting member may include a second connecting member electrically connected to the driving voltage line and the second conductive region through the third opening.

An edge portion of the gate electrode, an edge portion of the oxide pattern layer, and an edge portion of the insulating pattern layer may be aligned with each other.

The edge portion of the insulating pattern layer may be aligned with a boundary area between the channel region and the conductive region.

In an embodiment, a display device may include: a substrate; a first conductive layer including a conductive pattern layer disposed on the substrate; a buffer layer disposed on the first conductive layer; an active pattern layer disposed on the buffer layer and including a channel region and a conductive region adjacent to the channel region; a first insulating layer including an insulating pattern layer disposed on the channel region; an oxide pattern layer disposed on the insulating pattern layer; a connecting member disposed on the first insulating layer; and a gate electrode disposed on the oxide pattern layer, wherein the connecting member may be electrically connected to the conductive pattern layer and the conductive region, and the connecting member and the oxide pattern layer may include a same material.

A carrier concentration of the connecting member may be higher than a carrier concentration of the oxide pattern layer.

The first insulating layer and the buffer layer may have a first opening exposing the conductive pattern layer, the conductive region may include a first conductive region adjacent to a first side of the channel region, and the connecting member may include a first connecting member electrically connected to the conductive pattern layer and the first conductive region through the first opening.

The display device may further include a second insulating layer disposed on the gate electrode and the connecting member, wherein the second insulating layer may contact an upper surface of the gate electrode and an upper surface of the connecting member.

The display device may further include a third insulating layer disposed on the second insulating layer; and a pixel electrode disposed on the third insulating layer, wherein the second insulating layer and the third insulating layer may have a second opening exposing the first connecting member, and the pixel electrode may be electrically connected to the first connecting member through the second opening.

A conductive layer may not be disposed between the second insulating layer and the third insulating layer.

The first conductive layer may further include a driving voltage line. The driving voltage line and the conductive pattern layer may include a same conductive material, and the first insulating layer and the buffer layer may have a third opening exposing the driving voltage line, the conductive region may include a second conductive region adjacent to a second side of the channel region, and the connecting member may include a second connecting member electrically connected to the driving voltage line and the second conductive region through the third opening.

In an embodiment, a method for manufacturing a display device may include: forming a first conductive layer including a conductive pattern layer on a substrate; forming a buffer layer on the first conductive layer; forming a semiconductor layer on the buffer layer; forming a first insulating layer on the semiconductor layer; forming a first opening exposing a part of the first conductive layer and a second opening exposing a part of the semiconductor layer by patterning the first insulating layer and the buffer layer; forming an oxide layer on the first insulating layer; forming a second conductive layer on the oxide layer; forming an oxide pattern layer and a gate electrode disposed on the oxide pattern layer by patterning the second conductive layer and the oxide layer; exposing an upper surface of the oxide layer without exposing an upper surface of the oxide pattern layer by removing the second conductive layer without removing the gate electrode; forming an insulating pattern layer disposed below the oxide pattern layer by patterning the first insulating layer; and making the exposed oxide layer conductive to form a conductive oxide layer.

The conductive oxide layer may be electrically connected to the part of the first conductive layer through the first opening.

The method may further include heat-treating the oxide layer after the forming of the oxide layer.

According to the embodiments, the carrier concentration of the channel region of the transistor of the display device is controlled, and the number of masks used for a manufacturing process is reduced such that a manufacturing cost and time may be reduced. The contact resistance between conductive layers is reduced such that deterioration of characteristics of the light-emitting device may be reduced.

DETAILED DESCRIPTION OF THE EMBODIMENTS

Figure 1:
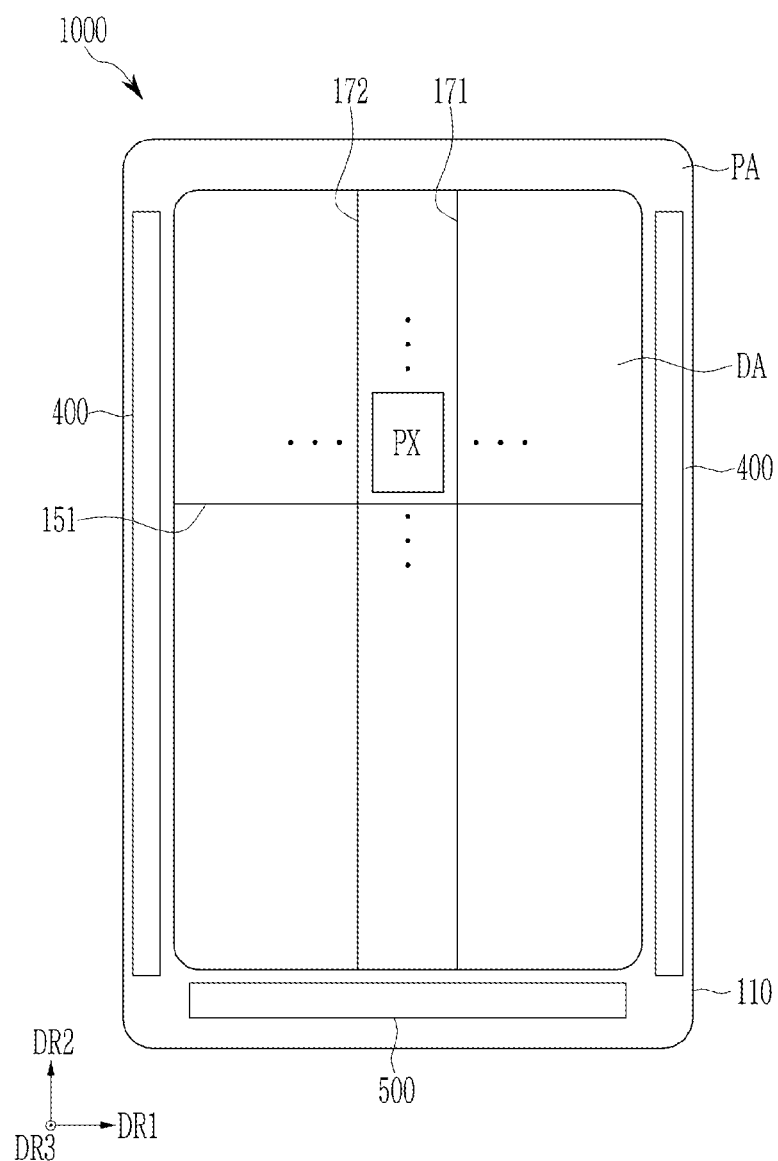
FIG. 1 shows a schematic top plan view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The phrase "in a plan view" means viewing an object portion from the top, and the phrase "in a cross-sectional view" means viewing a cross-section of which the object portion is vertically cut from the side.

A display device according to an embodiment will now be described with reference to FIG. 1.

FIG. 1 shows a schematic top plan view of a display device 1000 according to an embodiment.

Referring to FIG. 1, the display device 1000 according to an embodiment may include an organic light emitting device, a plasma display device, a field emission display, a quantum dot emissive display device, a micro LED display device, and a liquid crystal display. The disclosure describes the organic light emitting device as the display device 1000, but embodiments are not limited thereto.

The display device 1000 may include a substrate 110 including a display area DA, in which pixels PX for displaying images are disposed, and a peripheral area PA disposed around the display area DA. The peripheral area PA may include the pixels PX and may display images, or may not include the pixels PX.

The substrate 110 may have a side that is parallel to a first direction DR1 and a second direction DR2 that is perpendicular to the first direction DR1, and a direction that is perpendicular to the substrate 110 upward is marked as a third direction DR3. A view on the plane in the first direction DR1 and the second direction DR2 is referred to as a plan view, and a view on a cross-section in its perpendicular direction is referred to as a cross-sectional view.

Signal lines or voltage lines electrically connected to the pixels PX and applying signals or driving voltages may be positioned in the display area DA. The signal lines or the voltage lines may include scan lines 151 for transmitting scan signals to the pixels PX, data lines 171 for transmitting data signals to the pixels PX, and driving voltage lines 172 for transmitting a driving voltage to the pixels PX. The respective pixels PX may include at least one transistor, at least one light-emitting device, and at least one capacitor.

In a plan view, the driving voltage lines 172 and the data lines 171 may substantially extend in the second direction DR2, but embodiments are not limited thereto. In a plan view, the scan lines 151 may substantially extend in the first direction DR1, but embodiments are not limited thereto.

A scan driver 400 connected to the scan lines 151 and supplying scan signals and a data driver 500 connected to the data lines 171 and supplying data signals may be positioned in the peripheral area PA.

The scan driver 400 may include transistors formed on the substrate together with the transistors positioned in the display area DA. FIG. 1 shows an example in which the scan driver 400 is positioned on respective sides of the display area DA. However, embodiments are not limited thereto, the scan driver 400 may be positioned on a side.

The data driver 500 may be made of an integrated circuit (IC), and may be mounted on the substrate or a circuit board connected to the substrate. The data driver 500 may apply driving voltages to the driving voltage line 172.

A structure disposed around the transistors included by the pixels of the display device 1000 according to an embodiment will now be described with reference to FIG. 2 and FIG. 3 together with FIG. 1.

Figure 2:
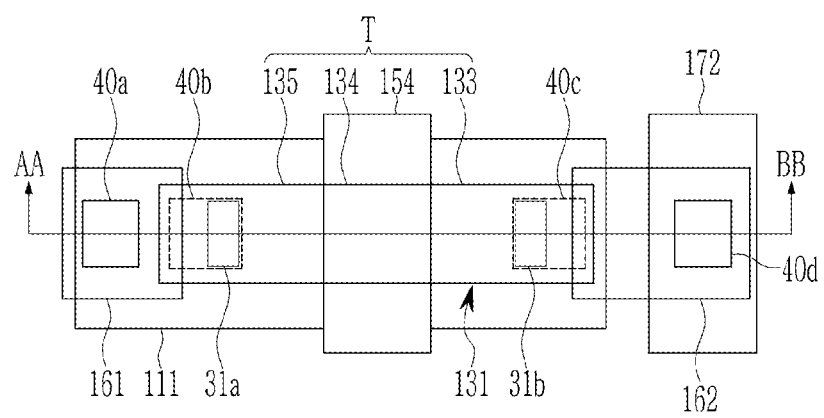
FIG. 2 shows a schematic top plan view of a region in which a transistor is positioned, disposed in a display area of a display device according to an embodiment.
Figure 3:
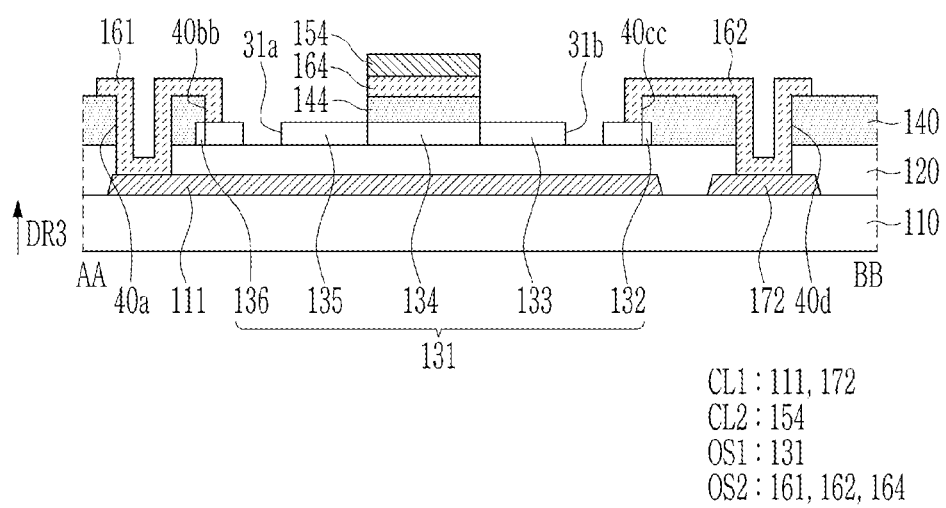
FIG. 3 shows a schematic cross-sectional view of a display device with respect to a line AA-BB shown in FIG. 2.

FIG. 2 shows a schematic top plan view of a region in which a transistor is positioned, disposed in a display area of a display device according to an embodiment, and FIG. 3 shows a schematic cross-sectional view of a display device with respect to a line AA-BB shown in FIG. 2.

Referring to FIG. 2 and FIG. 3, the display device 1000 may include a substrate 110. The substrate 110 may include an insulating material such as glass or plastic, and may have flexibility.

A first conductive layer CL1 including a conductive pattern layer 111 and signal lines and voltage lines may be positioned on the substrate 110. The signal lines and voltage lines may include a driving voltage line 172, a data line 171, a common voltage line, and an initialization voltage line.

The conductive pattern layer 111 may be positioned on the above-noted pixels PX. The conductive pattern layer 111 may include various conductive metals or a semiconductor material with a conductive characteristic corresponding to them.

A buffer layer 120 may be an insulating layer, and may be positioned on the first conductive layer CL1. The buffer layer 120 may include an inorganic insulating material and/or an organic insulating material such as a silicon nitride ($SiN_x$), a silicon oxide ($SiO_x$), or a silicon oxynitride ($SiO_xN_y$).

An active layer may include active pattern layers 131, and may be positioned on the buffer layer 120. The active pattern layers 131 positioned on the respective pixels PX may include a channel region 134 for forming a channel of the transistor T, and conductive regions positioned around (or adjacent to) respective sides of the channel region 134. The conductive regions of the active pattern layer 131 may include a source region 133 and a drain region 135 of the transistor T. The positions of the source region 133 and the drain region 135 may be exchangeable.

The drain region 135 may include an opening 31a formed in a portion, and the source region 133 may include an opening 31b formed in a portion. However, embodiments are not limited thereto. As shown in FIG. 2, the respective openings 31a and 31b may be island types formed in the drain region 135 and the source region 133. Hence, carriers (e.g., holes and/or electrons) may move through the portion of the drain region 135 above and/or below the opening 31a, and the carriers may move through the portion of the source region 133 above and/or below the opening 31b.

The active layer may include an oxide semiconductor at least one of indium (In), gallium (Ga), zinc (Zn), tin (Sn), hafnium (Hf), and titanium (Ti), and oxygen (O). For example, the active layer may include at least one of an ITO, an IGZO, an ITGZO, or an IGTO. The active layer may also be referred to as a first oxide semiconductor layer OS1.

The active pattern layer 131 may further include a source outer region 132 positioned outside the source region 133, and a drain outer region 136 positioned outside the drain region 135. The source outer region 132 and the drain outer region 136 may respectively have a carrier concentration that is less than the carrier concentration of the source region 133 and the drain region 135. In another example, the source outer region 132 and the drain outer region 136 may be omitted.

The conductive pattern layer 111 may overlap the active pattern layer 131 of the transistor T, e.g., the channel region 134, to prevent external light from reaching the channel region 134, thereby reducing a leakage current and deterioration of characteristics of the transistor T.

A first insulating layer 140 may be positioned on the active layer including the active pattern layer 131. The first insulating layer 140 is referred to as a gate insulating layer.

The first insulating layer 140 may have openings 40a, 40bb, 40cc, and 40d.

The opening 40a may extend to the buffer layer 120 and may expose the upper portion of the conductive pattern layer 111, e.g., by passing through the first insulating layer 140 and the buffer layer 120. For example, the first insulating layer 140 and the buffer layer 120 may have an opening 40a overlapping the conductive pattern layer 111.

The opening 40bb may be formed to the upper portion of the active pattern layer 131 and may expose the upper portion of the drain region 135. For example, the first insulating layer 140 may have an opening 40bb overlapping a part of the active pattern layer 131, e.g., the drain region 135. The opening 40bb may overlap the opening 31a of the drain region 135 in a plan view.

The opening 40cc may expose the upper portion of the active pattern layer 131, e.g., the upper portion of the source region 133. For example, the first insulating layer 140 may have an opening 40cc overlapping a part of the active pattern layer 131, e.g., the source region 133. The opening 40cc may overlap the opening 31b of the source region 133 in a plan view.

The opening 40d may extend to the buffer layer 120 and may expose the upper portion of the driving voltage line 172, e.g., by passing through the first insulating layer 140 and the buffer layer 120. For example, the first insulating layer 140 and the buffer layer 120 may have the opening 40d overlapping the driving voltage line 172.

An insulating pattern layer 144 positioned in the first insulating layer 140 may be positioned between the opening 40bb and the opening 40cc. The insulating pattern layer 144 may be considered to be included in the first insulating layer 140, and the insulating pattern layer 144 may be spaced from the other first insulating layer 140. The insulating pattern layer 144 and the first insulating layer 140 may be formed of (or may include) a same material (e.g., a same insulating material). The insulating pattern layer 144 and the first insulating layer 140 may have different thicknesses. For example, the thickness of the insulating pattern layer 144 may be smaller than the thickness of the first insulating layer 140.

The insulating pattern layer 144 may overlap the channel region 134 of the active pattern layer 131, e.g., in a plan view, and may be positioned on the channel region 134. The insulating pattern layer 144 may not substantially overlap the conductive region of the active pattern layer 131. An edge portion of the insulating pattern layer 144 may include an edge portion aligned with a boundary area between the channel region 134 and the drain region 135, and an edge portion aligned with a boundary area between the channel region 134 and the source region 133.

A second oxide semiconductor layer OS2 may include an oxide pattern layer 164 and connecting members 161 and 162. The second oxide semiconductor layer OS2 may be positioned on the first insulating layer 140 including the insulating pattern layer 144.

The oxide pattern layer 164 may be positioned on the insulating pattern layer 144. The oxide pattern layer 164 may overlap the channel region 134 of the active pattern layer 131 and the insulating pattern layer 144, and may not substantially overlap the conductive region of the active pattern layer 131. An edge portion of the oxide pattern layer 164 may be aligned with the edge portion of the insulating pattern layer 144, and may include an edge portion aligned with the boundary area between the channel region 134 and the drain region 135, and an edge portion aligned with the boundary area between the channel region 134 and the source region 133.

The connecting members 161 and 162 and the oxide pattern layer 164 may be positioned in a same layer, and may include a same material (e.g., a same oxide semiconductor material). The connecting member 161 may be electrically connected to the drain region 135 and the conductive pattern layer 111, and may electrically connect the drain region 135 and the conductive pattern layer 111 through the opening 40a. The connecting member 162 may be electrically connected to the source region 133 and the driving voltage line 172, and may electrically connect the source region 133 and the driving voltage line 172 through the opening 40d.

The connecting members 161 and 162 may have carrier concentrations that are higher than the carrier concentration of the oxide pattern layer 164 to thus have conductivity. For example, the connecting members 161 and 162 may include an oxygen depletion region and/or hydrogen having a higher concentration than the oxide pattern layer 164.

The oxide pattern layer 164 may function as an oxygen supplying layer for injecting oxygen to the active pattern layer 131 through the insulating pattern layer 144 during the process for manufacturing a display device. An oxygen depletion area may be partly formed on the active pattern layer 131 in a deposition process, and in case that an insulating layer is deposited on the active pattern layer 131, hydrogen (H) may be injected into the oxygen depletion area to increase mobility of the active pattern layer 131. However, in case that the carrier concentration is excessively increased, it may be difficult to obtain the driving voltage for the transistor T to drive the respective pixels PX.

According to an embodiment, the oxide pattern layer 164 may supply oxygen to the adjacent insulating pattern layer 144, the oxygen supplied to the insulating pattern layer 144 may be injected into the channel region 134 of the active pattern layer 131, and the hydrogen permeating into the oxygen depletion area of the active pattern layer 131 may be discharged again to the insulating pattern layer 144. The carrier concentration of the active pattern layer 131 may be reduced, a range of the driving voltage of the transistor T may be obtained, and dispersion (or distribution) of the initial threshold voltage of the transistor T may be increased.

The second oxide semiconductor layer OS2 may include the same material as the first oxide semiconductor layer OS1 (e.g., the oxide semiconductor included in the active layer including the active pattern layer 131). The first and second oxide semiconductor layers OS1 and OS2 may include different materials.

The oxide pattern layer 164 according to an embodiment may include at least one of indium (In), gallium (Ga), zinc (Zn), tin (Sn), and hafnium (Hf), and oxygen (O). For example, the oxide pattern layer 164 may include at least one of an IGZO, a TZO, a TGO, an ITZO, an ITGO, or an ITZGO.

A second conductive layer CL2 including a gate electrode 154 may be positioned on the oxide pattern layer 164. The second conductive layer CL2 may further include the above-noted scan line 151. The gate electrode 154 may overlap the channel region 134 of the active pattern layer 131, the insulating pattern layer 144, and the oxide pattern layer 164.

The gate electrode 154 may not substantially overlap the conductive region of the active pattern layer 131. An edge portion of the gate electrode 154 may be aligned with the edge portion of the oxide pattern layer 164 and the edge portion of the insulating pattern layer 144, and may include an edge portion aligned with the boundary area between the channel region 134 and the drain region 135 and an edge portion aligned with the boundary area between the channel region 134 and the source region 133. In the process for manufacturing a display device, the gate electrode 154 may be patterned with the oxide pattern layer 164 disposed therebelow.

The second conductive layer CL2 may include at least of metals including copper (Cu), aluminum (Al), magnesium (Mg), silver (Ag), gold (Au), platinum (Pt), palladium (Pd), nickel (Ni), neodymium (Nd), iridium (Jr), molybdenum (Mo), tungsten (W), titanium (Ti), chromium (Cr), tantalum (Ta), and their alloys.

A method for manufacturing a display device according to an embodiment will now be described with reference to FIG. 4 to FIG. 14 together with the above-noted drawings.

Figure 4:
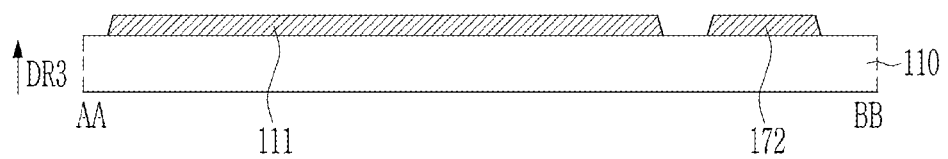
FIG. 4 shows a schematic cross-sectional view of a display device in a process according to a method for manufacturing a display device according to an embodiment.

FIG. 4 shows a schematic cross-sectional view of a display device in a process according to a method for manufacturing a display device according to an embodiment.

Referring to FIG. 4, various types of conductive metal or semiconductor materials with conductive characteristics corresponding thereto may be stacked on the substrate 110 (e.g., an insulative substrate) and may be patterned to form a first conductive layer CL1 including a conductive pattern layer 111 and signal lines and voltage lines such as driving voltage lines 172. For example, the conductive pattern layer 111 and the driving voltage lines 172 may include a same conductive material or may be formed of a same conductive material. The patterning method may use a photolithography process including an exposure method by using an optical mask.

Figure 5:
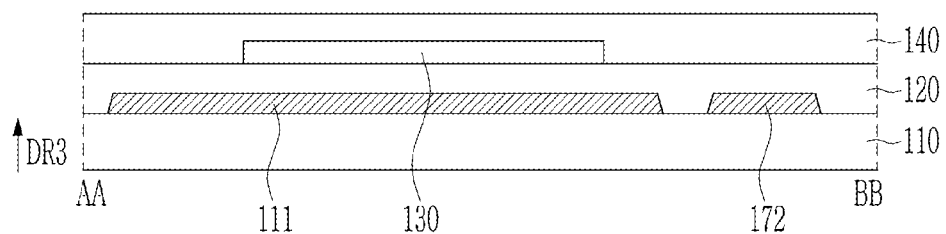
FIG. 5 shows a schematic cross-sectional view of a display device in a process according to a method for manufacturing a display device according to an embodiment, after the process shown in FIG. 4.

FIG. 5 shows a schematic cross-sectional view of a display device in a process according to a method for manufacturing a display device according to an embodiment, after the patterning process shown in FIG. 4.

Referring to FIG. 5, an insulating material may be stacked on the substrate 110 and the first conductive layer CL1 to form a buffer layer 120. A semiconductor material such as an oxide semiconductor may be stacked and patterned on the buffer layer 120 to form a semiconductor layer 130. An insulating material may be stacked on the semiconductor layer 130 and the buffer layer 120 to form a first insulating layer 140.

Figure 6:
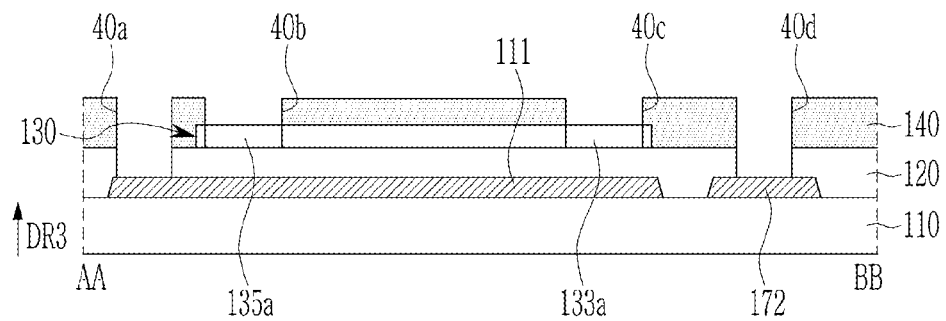
FIG. 6 shows a schematic cross-sectional view of a display device in a process according to a method for manufacturing a display device according to an embodiment, after the process shown in FIG. 5.

FIG. 6 shows a schematic cross-sectional view of a display device in a process according to a method for manufacturing a display device according to an embodiment, after the process shown in FIG. 5.

Referring to FIG. 6, the first insulating layer 140 and the buffer layer 120 may be patterned according to the photolithography process to form openings 40a, 40b, 40c, and 40d. In this instance, a dry etching process may be used.

The opening 40a may be formed in the first insulating layer 140 and the buffer layer 120 to expose an upper surface of the conductive pattern layer 111.

The opening 40b may be formed in the first insulating layer 140 to expose an upper surface of the semiconductor layer 130 shown in FIG. 5. In case that the opening 40b is etched, the oxygen depletion area may be increased in the exposed semiconductor layer 130 by an etching gas for dry etching and/or plasma, the carrier concentration (n+) of the portion 135a of the semiconductor layer 130 exposed by the opening 40b may be increased to be conductive.

The opening 40c may be formed in the first insulating layer 140 to expose the upper portion of the semiconductor layer 130 of FIG. 5. In case that the opening 40c is etched, the oxygen depletion area may increase in the semiconductor layer 130 because of physical damage by the etching gas for dry etching and/or plasma, the carrier concentration (n+) of the portion 133a of the semiconductor layer 130 exposed by the opening 40c may increase to be conductive.

Planar shapes of the opening 40b and the opening 40c are shown with dotted lines in FIG. 2.

The opening 40d may be formed in the first insulating layer 140 and the buffer layer 120 to expose the upper portion of the driving voltage line 172.

Figure 7:
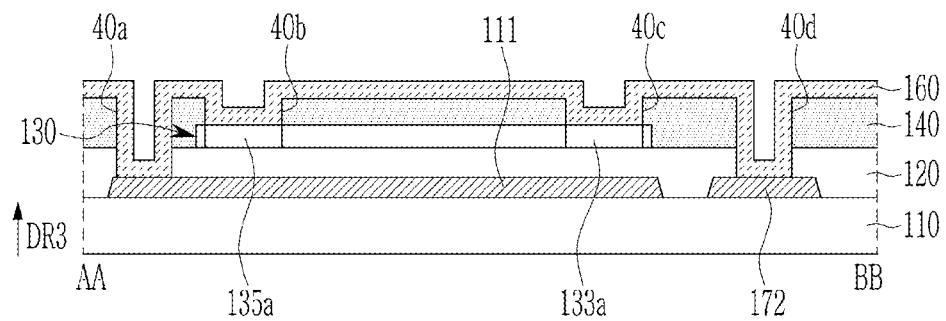
FIG. 7 shows a schematic cross-sectional view of a display device in a process according to a method for manufacturing a display device according to an embodiment, after the process shown in FIG. 6.

FIG. 7 shows a schematic cross-sectional view of a display device in a process according to a method for manufacturing a display device according to an embodiment, after the process shown in FIG. 6.

Referring to FIG. 7, the oxide layer 160 may be formed on the patterned first insulating layer 140. The oxide layer 160 and the semiconductor layer 130 may include the same material, or may include a different material. The oxide layer 160 may be formed by using a sputtering process or a deposition process. In case that the oxide layer 160 is deposited, oxygen may be injected into the first insulating layer 140.

The oxide layer 160 may then be heat-treated by a heat treatment process. By the heat treatment process, oxygen may be further injected into the first insulating layer 140 from the oxide layer 160, and the oxygen in the first insulating layer 140 may be prevented by the oxide layer 160 from being vaporized upward and may be further injected downward into the semiconductor layer 130.

Figure 8:
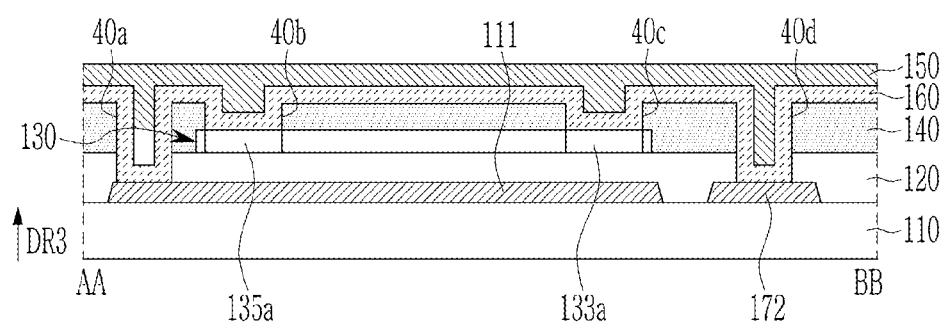
FIG. 8 shows a schematic cross-sectional view of a display device in a process according to a method for manufacturing a display device according to an embodiment, after the process shown in FIG. 7.
Figure 9:
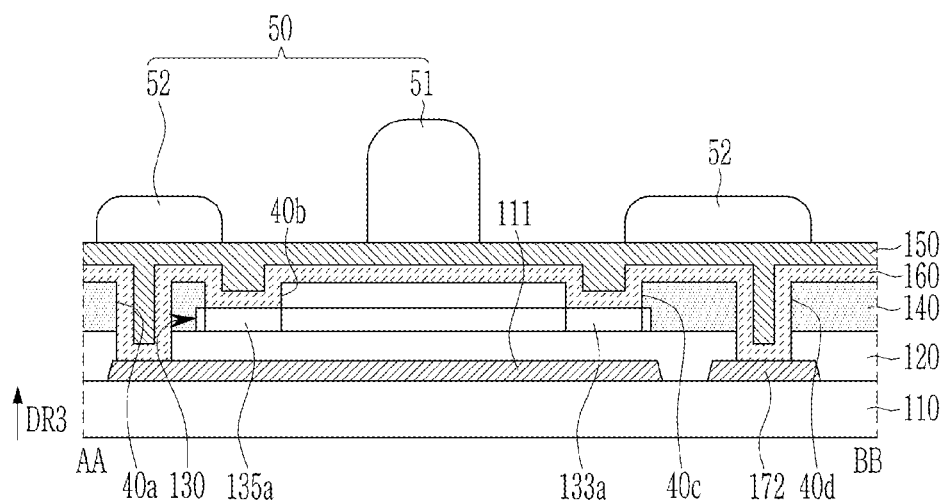
FIG. 9 shows a schematic cross-sectional view of a display device in a process according to a method for manufacturing a display device according to an embodiment, after the process shown in FIG. 8.

FIG. 8 shows a schematic cross-sectional view of a display device in a process according to a method for manufacturing a display device according to an embodiment, after the process shown in FIG. 7, and FIG. 9 shows a schematic cross-sectional view of a display device in a process according to a method for manufacturing a display device according to an embodiment, after the process shown in FIG. 8.

Referring to FIG. 8, a conductive material may be stacked on the oxide layer 160 to form a conductive layer 150.

Referring to FIG. 9, a photosensitive material layer such as photoresist may be stacked on the conductive layer 150, and the photosensitive material layer may be exposed by using a halftone optical mask so the mask pattern layer 50 may be formed. The mask pattern layer 50 may include a first portion 51 and a second portion 52 that is thinner than the first portion 51. The first portion 51 may include a portion overlapping the channel region 134 of the active pattern layer 131.

Figure 10:
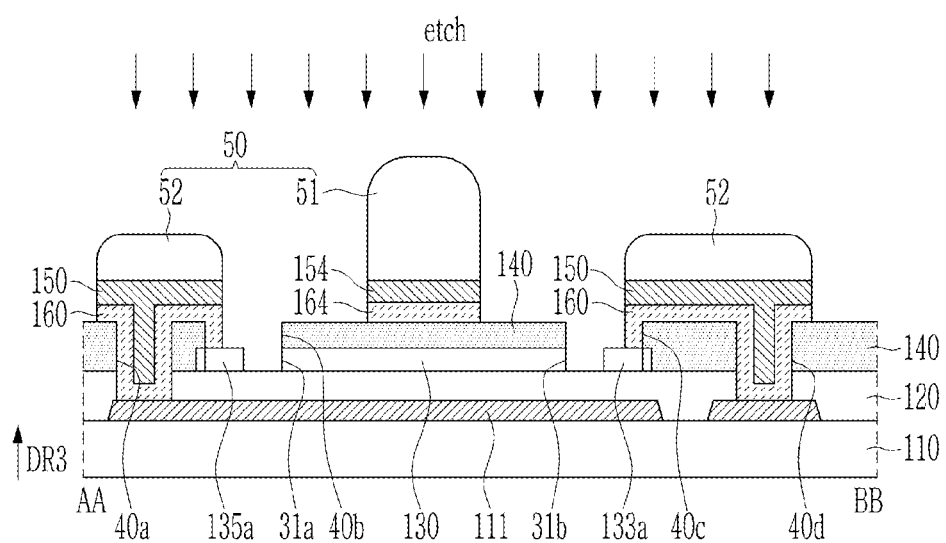
FIG. 10 shows a schematic cross-sectional view of a display device in a process according to a method for manufacturing a display device according to an embodiment, after the process shown in FIG. 9.

FIG. 10 shows a schematic cross-sectional view of a display device in a process according to a method for manufacturing a display device according to an embodiment, after the process shown in FIG. 9.

Referring to FIG. 10, the conductive layer 150 and the oxide layer 160 may be etched by using the mask pattern layer 50 as an etching mask to expose the portions 133a and 135a that are changed to be conductive on the semiconductor layer 130. In this instance, the gate electrode 154 overlapping the first portion 51 of the mask pattern layer 50 and an oxide pattern layer 164 disposed therebelow may be simultaneously patterned.

A partial region of the portion 135a of the semiconductor layer 130, which is distant from the second portion 52 of the adjacent mask pattern layer 50, may be removed to form the opening 31a. A partial region of the portion 133a of the semiconductor layer 130, which is distant from the second portion 52 of the adjacent mask pattern layer 50, may be removed to form the opening 31b. However, embodiments are not limited thereto.

Figure 11:
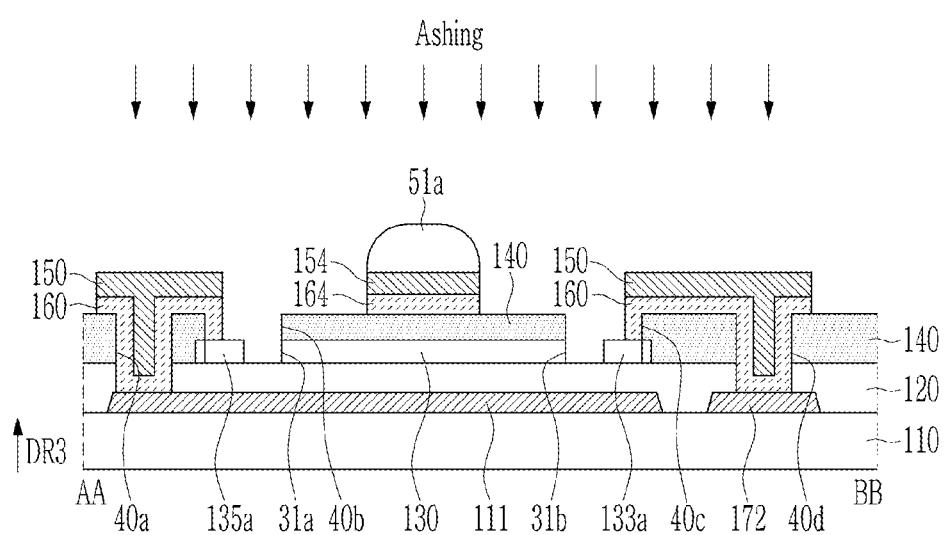
FIG. 11 shows a schematic cross-sectional view of a display device in a process according to a method for manufacturing a display device according to an embodiment, after the process shown in FIG. 10.

FIG. 11 shows a schematic cross-sectional view of a display device in a process according to a method for manufacturing a display device according to an embodiment, after the process shown in FIG. 10.

Referring to FIG. 11, the mask pattern layer 50 shown in FIG. 10 may be etched back or ashed to remove the second portion 52, and a mask pattern layer 51a including the first portion 51 that became thin is formed. The mask pattern layer 51a may overlap the gate electrode 154 and the oxide pattern layer 164. For example, an upper surface of the conductive layer 150 may be exposed, and an upper surface of the gate electrode 154 may not be exposed.

Figure 12:
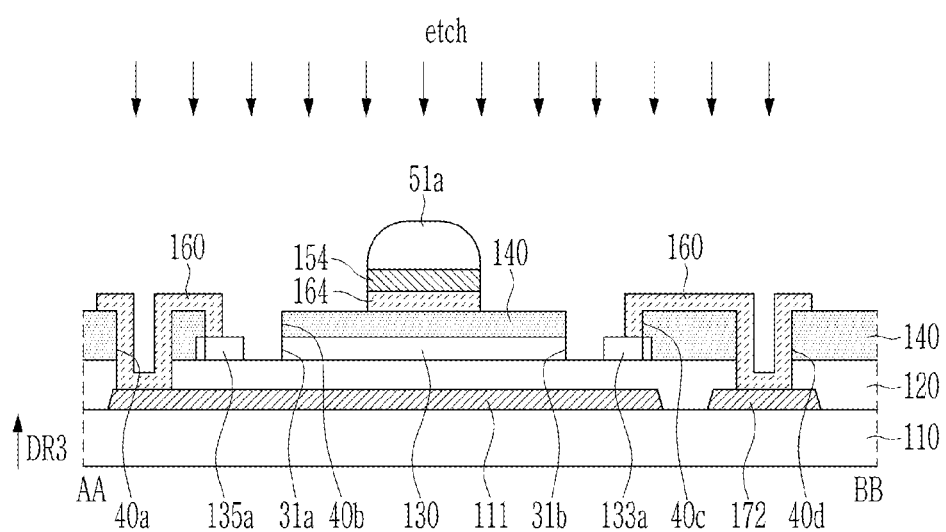
FIG. 12 shows a schematic cross-sectional view of a display device in a process according to a method for manufacturing a display device according to an embodiment, after the process shown in FIG. 11.

FIG. 12 shows a schematic cross-sectional view of a display device in a process according to a method for manufacturing a display device according to an embodiment, after the process shown in FIG. 11.

Referring to FIG. 12 together with FIG. 11, the exposed conductive layer 150 may be etched and removed by using the mask pattern layer 51a as an etching mask. In this instance, a wet etching process may be used, and an etchant that has sufficiently great selectivity for the conductive layer 150 with respect to the oxide layer 160 may be used. Accordingly, the conductive layer 150, which is not covered by the mask pattern layer 51a but is exposed, may be removed without removing the gate electrode 154, and an upper surface and/or a side surface of the oxide layer 160 may be exposed without being etched and damaged and without exposing an upper surface of the oxide pattern layer 164.

Figure 13:
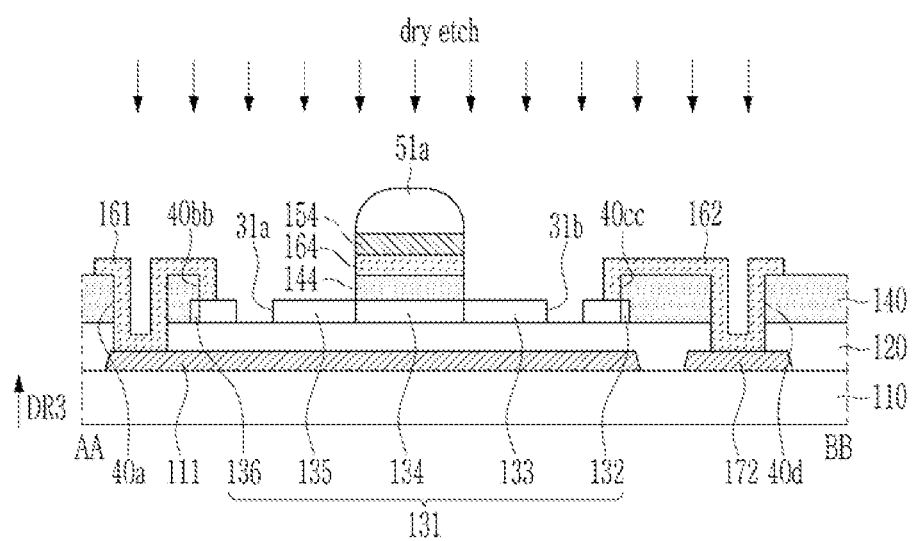
FIG. 13 shows a schematic cross-sectional view of a display device in a process according to a method for manufacturing a display device according to an embodiment, after the process shown in FIG. 12.

FIG. 13 shows a schematic cross-sectional view of a display device in a process according to a method for manufacturing a display device according to an embodiment, after the process shown in FIG. 12.

Referring to FIG. 13 together with FIG. 12, the exposed first insulating layer 140 may be etched by using the mask pattern layer 51a as an etching mask to form the insulating pattern layer 144 below the oxide pattern layer 164. In this instance, the dry etching process may be used.

The oxide layer 160 and the semiconductor layer 130 exposed during the etching process of the first insulating layer 140 may have a big oxygen depletion area because of the physical damage by the etching gas for a dry etching process and/or by plasma to increase the carrier concentration (n+) and be conductive. Accordingly, the active pattern layer 131 including the channel region 134 overlapping the insulating pattern layer 144, and the source region 133 and the drain region 135 disposed on respective sides thereof may be formed. The conductive oxide layer 160 may form a connecting member 161 electrically connected to the drain region 135 and the conductive pattern layer 111, and a connecting member 162 electrically connected to the source region 133 and the driving voltage line 172.

The active pattern layer 131 may further include a source outer region 132 positioned outside the source region 133, and a drain outer region 136 positioned outside the drain region 135. In another example, the source outer region 132 and the drain outer region 136 may be omitted. The source outer region 132 and the drain outer region 136 may be covered by the first insulating layer 140.

An opening 40bb for exposing the drain region 135 of the active pattern layer 131 and an opening 40cc for exposing the source region 133 of the active pattern layer 131 may be formed in the first insulating layer 140.

Figure 14:
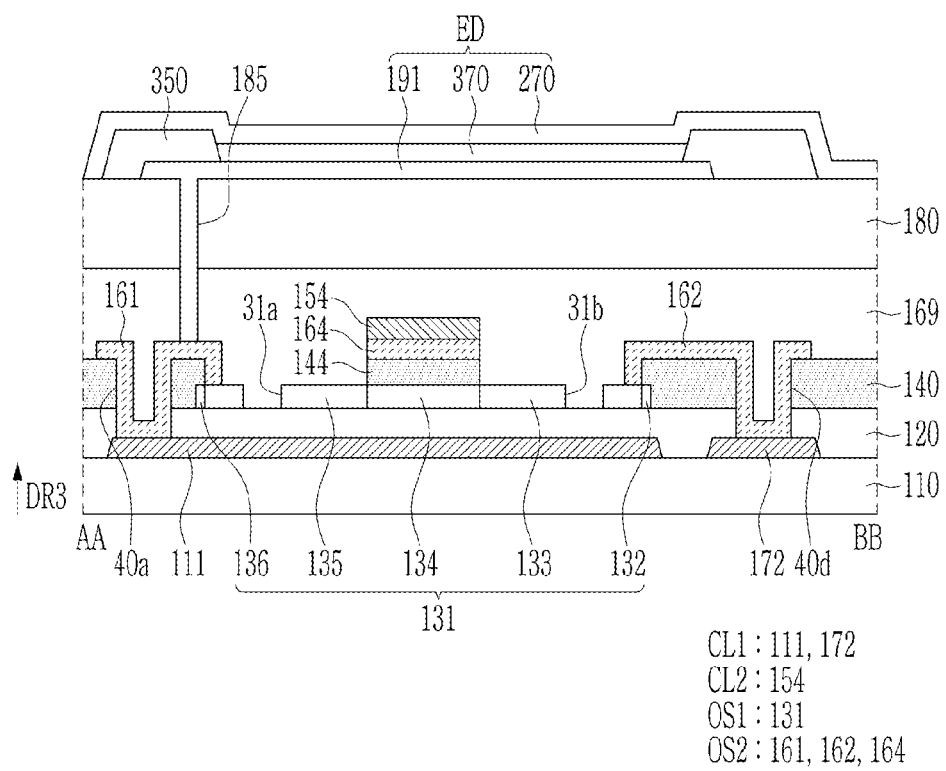
FIG. 14 shows a schematic cross-sectional view of a display device in a process according to a method for manufacturing a display device according to an embodiment, after the process shown in FIG. 13.

FIG. 14 shows a schematic cross-sectional view of a display device in a process according to a method for manufacturing a display device according to an embodiment, after the process shown in FIG. 13.

Referring to FIG. 14 together with FIG. 13, the mask pattern layer 51a may be removed, an insulating material (e.g., an inorganic insulating material) may be stacked on the substrate 110 to form a second insulating layer 169, and an insulating material (e.g., an organic insulating material) may be stacked on the second insulating layer 169 to form a third insulating layer 180. Hydrogen may be further injected into the source region 133 and the drain region 135 of the active pattern layer 131, and the connecting members 161 and 162 by the depositing gas such as silane or ammonia used for a process for stacking the second insulating layer 169.

An opening 185 for exposing the connecting member 161 may be formed by patterning the third insulating layer 180 and the second insulating layer 169.

A third conductive layer including a pixel electrode 191 may be formed by stacking a conductive material on the third insulating layer 180 and patterning the conductive material. The pixel electrode 191 may be electrically connected to the connecting member 161 and the drain region 135 of the transistor T through the opening 185. The third conductive layer may include a semi-transmitting conductive material or a reflective conductive material.

A fourth insulating layer 350 having an opening positioned on the pixel electrode 191 may be formed by stacking an insulating material on the pixel electrode 191 and the third insulating layer 180 and patterning the insulating material. The fourth insulating layer 350 may include an organic insulating material such as a polyacryl-based resin or a polyimide-based resin.

A light emitting diode ED may be formed by sequentially forming an emission layer 370 and a common electrode 270 on the pixel electrode 191 and the fourth insulating layer 350. The common electrode 270 may include a conductive transparent material. One of the pixel electrode 191 and the common electrode 270 may be a cathode and another one may be an anode.

The conductive pattern layer 111 may be electrically connected to the drain region 135 of the active pattern layer 131 and the pixel electrode 191 so a current change rate in a saturation region in a voltage-current characteristic graph of the transistor T may be reduced, and a range of a certain region of an output current of the transistor T may be increased. Hence, luminance deviation between the pixels according to the output current of the transistor T may be reduced, thereby increasing quality of the images of the display device 1000.

In an embodiment, the conductive pattern layer 111 and the drain region 135 of the transistor T may be electrically connected to each other through the connecting members 161 and 162 patterned by using the oxide pattern layer 164 and including the semiconductor material, and the driving voltage line 172 may be electrically connected to the source region 133 of the transistor T. Therefore, other conductive layers may not be disposed between the connecting members 161 and 162 and the second insulating layer 169.

Additional conductive layer may not be disposed between the second insulating layer 169 and the third insulating layer 180 on the pixel PX. However, embodiments are not limited thereto.

According to an embodiment, the concentration may be reduced by controlling the carrier concentration of the channel region of the transistor of the display device 1000. As the step of forming an additional conductive pattern layer for the connecting members 161 and 162 is omitted, the number of masks used in the process for manufacturing a display device 1000 may not be increased, thereby reducing a manufacturing cost and a manufacturing time of the display device 1000. Further, in the process for forming the connecting members 161 and 162 including the same material as the oxide pattern layer 164, the oxygen depletion area may be increased and the hydrogen may be supplied to make the connecting members 161 and 162 conductive so that contact resistance for an electrical connection between the conductive pattern layer 111 and the drain region 135 and between the driving voltage line 172 and the source region 133 may be reduced and deterioration of element characteristics of the transistor T and the light emitting diode ED may be reduced.

A structure of a pixel of a display device according to an embodiment will now be described with reference to FIG. 15 together with the above-described drawings.

Figure 15:
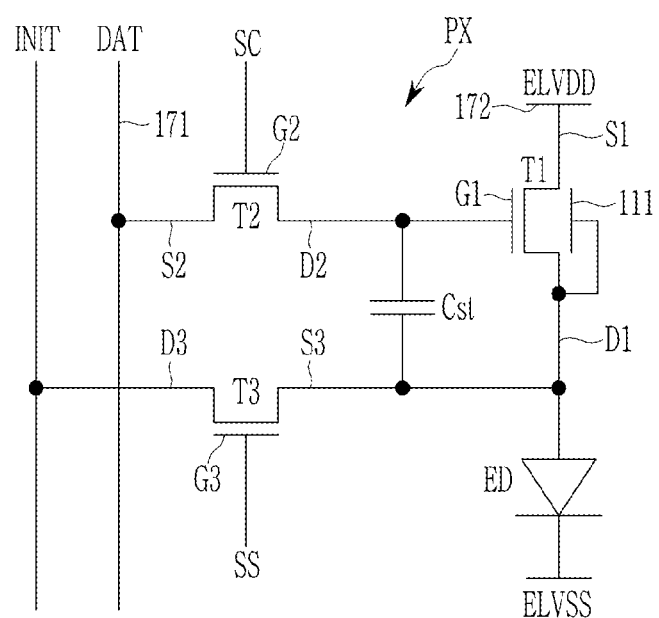
FIG. 15 shows a schematic diagram of an equivalent circuit of a pixel of a display device according to an embodiment.

FIG. 15 shows a schematic diagram of an equivalent circuit of a pixel of a display device according to an embodiment.

A pixel PX of the display device 1000 may include a pixel circuit including transistors T1, T2, and T3 and a capacitor Cst, and at least one light emitting diode ED that is a light-emitting device connected to the pixel circuit. In an embodiment, an example in which one pixel PX includes a light emitting diode ED will be described.

The transistors T1, T2, and T3 may include a first transistor T1, a second transistor T2, and a third transistor T3.

A gate electrode G1 of the first transistor T1 may be connected to a first end portion of the capacitor Cst, a source electrode S1 of the first transistor T1 may be connected to a driving voltage line for transmitting a driving voltage ELVDD, and a drain electrode D1 of the first transistor T1 may be connected to an anode of the light emitting diode ED and a second end portion of the capacitor Cst. The first transistor T1 may receive a data voltage DAT according to a switching operation of the second transistor T2, and may supply a driving current to the light emitting diode ED according to the voltage stored in the capacitor Cst.

The gate electrode G1 of the first transistor T1 may face the conductive pattern layer 111, and the conductive pattern layer 111 may be electrically connected to the drain electrode D1 of the first transistor T1 and the anode of the light emitting diode ED.

A gate electrode G2 of the second transistor T2 may be connected to a first scan line for transmitting a first scan signal SC, a source electrode S2 of the second transistor T2 may be connected to a data line 171 for transmitting a data voltage DAT or a reference voltage, and a drain electrode D2 of the second transistor T2 may be connected to the first end portion of the capacitor Cst and the gate electrode G1 of the first transistor T1. The second transistor T2 may be turned on by the first scan signal SC and may transmit the reference voltage or the data voltage DAT to the gate electrode G1 of the first transistor T1 and the first end portion of the capacitor Cst.

A gate electrode G3 of the third transistor T3 may be connected to the second scan line for transmitting a second scan signal SS, a source electrode S3 of the third transistor T3 may be connected to the second end portion of the capacitor Cst, the drain electrode D1 of the first transistor T1, and the anode of the light emitting diode ED, and the drain electrode D3 of the third transistor T3 may be connected to an initialization voltage line for transmitting an initialization voltage INIT. The third transistor T3 may be turned on by the second scan signal SS to transmit the initialization voltage INIT to the anode of the light emitting diode ED and the second end portion of the capacitor Cst and may initialize the voltage at the anode of the light emitting diode ED.

The first end portion of the capacitor Cst may be connected to the gate electrode G1 of the first transistor T1, and the second end may be connected to the source electrode S3 of the third transistor T3 and the anode of the light emitting diode ED. A cathode of the light emitting diode ED may be connected to a common voltage line for transmitting a common voltage ELVSS.

The light emitting diode ED may emit light with luminance according to the driving current generated by the first transistor T1.

The first transistor T1 may have a structure of the above-described transistor T.

The structure of the pixel PX included by the display device 1000 according to an embodiment is not limited to the circuit diagram shown in FIG. 1, and various types of pixel structures are allowable according to the type of the display device 1000.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
a substrate;
a conductive pattern layer disposed on the substrate;
a buffer layer disposed on the conductive pattern layer;
an active pattern layer disposed on the buffer layer and including a channel region and a conductive region adjacent to the channel region;
an insulating pattern layer disposed on the channel region;
an oxide pattern layer disposed on the insulating pattern layer;
a gate electrode disposed on the oxide pattern layer; and
a connecting member electrically connected to the conductive pattern layer and the conductive region, wherein
the connecting member and the oxide pattern layer include a same material.

2. The display device of claim 1, wherein
the oxide pattern layer and the connecting member include an oxide semiconductor.

3. The display device of claim 2, wherein
a carrier concentration of the connecting member is higher than a carrier concentration of the oxide pattern layer.

4. The display device of claim 3, further comprising:
a first insulating layer disposed between the connecting member and the buffer layer, wherein
the first insulating layer and the insulating pattern layer include a same insulating material.

5. The display device of claim 4, wherein
the first insulating layer and the buffer layer have a first opening exposing the conductive pattern layer,
the conductive region includes a first conductive region adjacent to a first side of the channel region, and
the connecting member includes a first connecting member electrically connected to the conductive pattern layer and the first conductive region through the first opening.

6. The display device of claim 5, further comprising:
a second insulating layer disposed on the gate electrode and the connecting member, wherein
the second insulating layer contacts an upper surface of the gate electrode and an upper surface of the connecting member.

7. The display device of claim 6, further comprising:
a third insulating layer disposed on the second insulating layer; and
a pixel electrode disposed on the third insulating layer, wherein
the second insulating layer and the third insulating layer have a second opening exposing the first connecting member, and
the pixel electrode is electrically connected to the first connecting member through the second opening.

8. The display device of claim 5, further comprising:
a driving voltage line, the driving voltage line and the conductive pattern layer including a same conductive material, wherein
the first insulating layer and the buffer layer have a third opening exposing the driving voltage line,
the conductive region includes a second conductive region adjacent to a second side of the channel region, and
the connecting member includes a second connecting member electrically connected to the driving voltage line and the second conductive region through the third opening.

9. The display device of claim 1, wherein
an edge portion of the gate electrode, an edge portion of the oxide pattern layer, and an edge portion of the insulating pattern layer are aligned with each other.

10. The display device of claim 9, wherein
the edge portion of the insulating pattern layer is aligned with a boundary area between the channel region and the conductive region.

11. A display device comprising:
a substrate;
a first conductive layer including a conductive pattern layer disposed on the substrate;
a buffer layer disposed on the first conductive layer;
an active pattern layer disposed on the buffer layer and including a channel region and a conductive region adjacent to the channel region;
a first insulating layer including an insulating pattern layer disposed on the channel region;
an oxide pattern layer disposed on the insulating pattern layer;
a connecting member disposed on the first insulating layer; and
a gate electrode disposed on the oxide pattern layer, wherein
the connecting member is electrically connected to the conductive pattern layer and the conductive region, and
the connecting member and the oxide pattern layer include a same material.

12. The display device of claim 11, wherein
a carrier concentration of the connecting member is higher than a carrier concentration of the oxide pattern layer.

13. The display device of claim 11, wherein
the first insulating layer and the buffer layer have a first opening exposing the conductive pattern layer,
the conductive region includes a first conductive region adjacent to a first side of the channel region, and
the connecting member includes a first connecting member electrically connected to the conductive pattern layer and the first conductive region through the first opening.

14. The display device of claim 13, further comprising:
a second insulating layer disposed on the gate electrode and the connecting member, wherein
the second insulating layer contacts an upper surface of the gate electrode and an upper surface of the connecting member.

15. The display device of claim 14, further comprising:
a third insulating layer disposed on the second insulating layer; and
a pixel electrode disposed on the third insulating layer, wherein
the second insulating layer and the third insulating layer have a second opening exposing the first connecting member, and
the pixel electrode is electrically connected to the first connecting member through the second opening.

16. The display device of claim 15, wherein
a conductive layer is not disposed between the second insulating layer and the third insulating layer.

17. The display device of claim 13, wherein
the first conductive layer further includes a driving voltage line,
the driving voltage line and the conductive pattern layer include a same conductive material,
the first insulating layer and the buffer layer have a third opening exposing the driving voltage line,
the conductive region includes a second conductive region adjacent to a second side of the channel region, and
the connecting member includes a second connecting member electrically connected to the driving voltage line and the second conductive region through the third opening.

18. A method for manufacturing a display device, the method comprising:
forming a first conductive layer including a conductive pattern layer on a substrate;
forming a buffer layer on the first conductive layer;
forming a semiconductor layer on the buffer layer;
forming a first insulating layer on the semiconductor layer;
forming a first opening exposing a part of the first conductive layer and a second opening exposing a part of the semiconductor layer by patterning the first insulating layer and the buffer layer;
forming an oxide layer on the first insulating layer;
forming a second conductive layer on the oxide layer;
forming an oxide pattern layer and a gate electrode disposed on the oxide pattern layer by patterning the second conductive layer and the oxide layer;
exposing an upper surface of the oxide layer without exposing an upper surface of the oxide pattern layer by removing the second conductive layer without removing the gate electrode;
forming an insulating pattern layer disposed below the oxide pattern layer by patterning the first insulating layer; and
making the oxide layer conductive to form a conductive oxide layer.

19. The method of claim 18, wherein
the conductive oxide layer is electrically connected to the part of the first conductive layer through the first opening.

20. The method of claim 18, further comprising:
heat-treating the oxide layer after the forming of the oxide layer.

* * * * *